United States Patent
Ye

(10) Patent No.: US 11,853,511 B2
(45) Date of Patent: Dec. 26, 2023

(54) TOUCH DISPLAY DEVICE AND TIME CONTROL METHOD WITH TOUCH SIGNAL WITHIN NON-EFFECTIVE TIME PERIOD OF HSYNC

(71) Applicant: WUHAN CHINA STAR OPTOELECTRONICS SEMICONDUCTOR DISPLAY TECHNOLOGY CO., LTD., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 79 days.

(21) Appl. No.: 17/626,612

(22) PCT Filed: Jan. 7, 2022

(86) PCT No.: PCT/CN2022/070775
§ 371 (c)(1),
(2) Date: Jan. 12, 2022

(87) PCT Pub. No.: WO2023/123540
PCT Pub. Date: Jul. 6, 2023

(65) Prior Publication Data
US 2023/0205366 A1    Jun. 29, 2023

(51) Int. Cl.
*G06F 3/041* (2006.01)
*G06F 3/044* (2006.01)
(Continued)

(52) U.S. Cl.
CPC ........ *G06F 3/04184* (2019.05); *G06F 3/0412* (2013.01); *G06F 3/0446* (2019.05);
(Continued)

(58) Field of Classification Search
CPC ............... G06F 3/0412; G06F 3/04166; G06F 3/04184; G06F 3/0446
See application file for complete search history.

(56) References Cited

U.S. PATENT DOCUMENTS

2014/0139480 A1* 5/2014 Seo ................ G06F 3/0443
345/174
2020/0004378 A1 1/2020 Liang et al.
(Continued)

FOREIGN PATENT DOCUMENTS

| CN | 103870054 A | 6/2014 |
| CN | 109686335 A | 4/2019 |

(Continued)

*Primary Examiner* — Liliana Cerullo
(74) *Attorney, Agent, or Firm* — Mark M. Friedman

(57) ABSTRACT

The present application provides a touch display device and time control method thereof that make a data signal jumps within an effective time period of a row synchronization signal and keep constant within in a non-effective time period of the row synchronization signal, and simultaneously, make a charge time period of a touch signal within the non-effective time period of the row synchronization signal. As such, the data signal in a jump variation time period would not suffer crosstalk due to charging of the touch signal, and would not form a phenomenon such as interfering horizontal mura due to crosstalk on the data line resulting from charging of the touch electrode.

15 Claims, 12 Drawing Sheets

(51) Int. Cl.
  *G09G 3/3208*   (2016.01)
  *H10K 59/40*   (2023.01)
(52) U.S. Cl.
  CPC ....... *G06F 3/04166* (2019.05); *G09G 3/3208* (2013.01); *H10K 59/40* (2023.02); *G09G 2310/067* (2013.01); *G09G 2310/08* (2013.01); *G09G 2354/00* (2013.01)

(56) References Cited

U.S. PATENT DOCUMENTS

2020/0326815 A1\* 10/2020 Choi .................... G06F 3/0446
2022/0189369 A1\*  6/2022 Kim ........................ G09G 3/20

FOREIGN PATENT DOCUMENTS

| CN | 110211539 A | 9/2019 |
| CN | 112230800 A | 1/2021 |
| CN | 112259051 A | 1/2021 |
| CN | 113625894 A | 11/2021 |
| CN | 113625902 A | 11/2021 |

\* cited by examiner

TOUCH DISPLAY DEVICE AND TIME CONTROL METHOD WITH TOUCH SIGNAL WITHIN NON-EFFECTIVE TIME PERIOD OF HSYNC

FIELD OF INVENTION

The present invention relates to a field of display technologies, especially to a touch display device and time control method thereof.

BACKGROUND OF INVENTION

Because a touch electrode of an organic emitting diode (OLED) touch display device is generally made on an upper surface of a thin film encapsulation layer (TFE), and a thickness of the thin film encapsulation layer is thin, usually only about 10 microns, for the OLED touch display device with synchronized touch and display, when the touch display device operates, a touch signal in the touch electrode easily generate crosstalk to data line data under the thin film encapsulation layer such that a potential of some of the data line data fluctuates and results in abnormal display of the touch display device. The data line data suffering the crosstalk would cause a phenomenon such as interfering horizontal mura.

Therefore, a method capable of adjusting a time of signals of a touch display device is urgently required such that when the touch display device operates, the touch electrode would not cause crosstalk to a data line to result in fluctuation of a potential of the data line to make display images have phenomenon such as interfering horizontal mura.

SUMMARY OF INVENTION

Technical Issue

For an OLED touch display device with synchronized touch and display, when the touch display device operates, a touch signal in the touch electrode easily generates crosstalk to data line data under the thin film encapsulation layer such that a potential of some of the data line data fluctuates and results in abnormal display of the touch display device. The data line data suffering the crosstalk would cause a phenomenon such as interfering horizontal mura.

Technical Solution

To solve the above issue, an embodiment of the present invention provides a touch display device and time control method thereof.

In a first aspect, the embodiment of the present invention provides a touch display device, comprising a touch sensor configured to sense a user's touch signal, and further comprising:

a time controller configured to receive a row synchronization signal, wherein the row synchronization signal comprises an effective time period and a non-effective time period;

a data driver configured to generate a data signal responsive to the row synchronization signal, wherein the data signal comprises a jump variation time period and a sustain time period; wherein the jump variation time period corresponds to the effective time period of the row synchronization signal, and the sustain time period of the data signal corresponds to the non-effective time period of the row synchronization signal; and an input controller configured to generate a touch signal and transmit the touch signal to the touch sensor, wherein the touch signal comprises a charge time period; wherein the charge time period of the touch signal is within the non-effective time period of the row synchronization signal.

In some embodiments, the time controller is further configured to receive a scan clock signal and generate a data enabling signal configured to control the data driver; wherein each of the scan clock signal and the data enabling signal comprises an effective time period and a non-effective time period, the effective time period of the scan clock signal is within the sustain time period of the data signal, and is within the effective time period of the data enabling signal;

the input controller is further configured to set the charge time period of the touch signal within the effective time period of the data enabling signal.

In some embodiments, the input controller is further configured to reduce a duty ratio of the touch signal to shorten the charge time period of the touch signal.

In some embodiments, the time controller is further configured to receive a frame synchronization signal and generate a frame enabling signal configured to control the data driver;

the input controller stores touch node basis capacitor values corresponding to different frequencies of the touch display device in advance, and the touch node basis capacitor values are touch node capacitor values of the touch display device not touched; and when the touch display device has frequency variation, the time controller is further configured to adjust a frequency of the frame enabling signal to make a frequency of the row synchronization signal vary accordingly; the input controller is further configured to make a frequency of the touch signal vary accordingly, determine each of the touch node basis capacitor values corresponding to a current frequency according to the touch node basis capacitor values corresponding to the different frequencies of the touch display device stored in advance, and determine a location of a target touch node according to each of the touch node basis capacitor values corresponding to the current frequency of the touch display device.

In some embodiments, when the touch display device has the frequency variation, the time controller is further configured to keep the frequency of the frame enabling signal to make the frequency of the row synchronization signal keep constant; the input controller is further configured to make the frequency of the touch signal keep constant, and determine a location of a target touch node according to each of the touch node basis capacitor values corresponding to an initial frequency of the touch display device.

In some embodiments, the time controller is specifically configured to adjust a length of a front shoulder or a rear shoulder of the frame enabling signal according to frequency variation of the touch display device to keep the frequency of the frame enabling signal constant, and length variation of the front shoulder or the rear shoulder of the frame enabling signal is negatively relative to the frequency variation of the touch display device.

In some embodiments, the touch display device is a mutual capacitive touch display device.

In some embodiments, the touch display device is a self-capacitive touch display device.

In a second aspect, the embodiment of the present invention also provides a touch display device, comprising a touch sensor configured to sense a user's touch signal, and further comprising:

a time controller configured to receive a row synchronization signal, a scan clock signal and a data enabling signal, wherein each of the row synchronization signal, the scan clock signal, and the data enabling signal comprises an effective time period and a non-effective time period;

a data driver configured to generate a data signal responsive to the row synchronization signal, wherein the data signal comprises a jump variation time period and a sustain time period; wherein the jump variation time period corresponds to the effective time period of the row synchronization signal, and the sustain time period of the data signal corresponds to the non-effective time period of the row synchronization signal; and an input controller configured to generate a touch signal and transmit the touch signal to the touch sensor, wherein the touch signal comprises a charge time period; wherein the charge time period of the touch signal is within the non-effective time period of the row synchronization signal and within the effective time period of the data enabling signal.

In some embodiments, the input controller is further configured to reduce a duty ratio of the touch signal to shorten the charge time period of the touch signal.

In some embodiments, the time controller is further configured to receive a frame synchronization signal and generate a frame enabling signal configured to control the data driver;

the input controller stores touch node basis capacitor values corresponding to different frequencies of the touch display device in advance, and the touch node basis capacitor values are touch node capacitor values of the touch display device not touched; and when the touch display device has frequency variation, the time controller is further configured to adjust a frequency of the frame enabling signal to make a frequency of the row synchronization signal vary accordingly; the input controller is further configured to make a frequency of the touch signal vary accordingly, determine each of the touch node basis capacitor values corresponding to a current frequency according to the touch node basis capacitor values corresponding to the different frequencies of the touch display device stored in advance, and determine a location of a target touch node according to each of the touch node basis capacitor values corresponding to the current frequency of the touch display device.

In some embodiments, when the touch display device has the frequency variation, the time controller is further configured to keep the frequency of the frame enabling signal to make the frequency of the row synchronization signal keep constant; the input controller is further configured to make the frequency of the touch signal keep constant, and determine a location of a target touch node according to each of the touch node basis capacitor values corresponding to an initial frequency of the touch display device.

In some embodiments, the time controller is specifically configured to adjust a length of a front shoulder or a rear shoulder of the frame enabling signal according to frequency variation of the touch display device to keep the frequency of the frame enabling signal constant, and length variation of the front shoulder or the rear shoulder of the frame enabling signal is negatively relative to the frequency variation of the touch display device.

In some embodiments, the touch display device is a mutual capacitive touch display device.

In some embodiments, the touch display device is a self-capacitive touch display device.

In a third aspect, the embodiment of the present invention also provides a time control method for a touch display device, comprising:

when a row of pixel units switch on, a row synchronization signal achieves to be effective, after a data signal jumps, the row synchronization signal that is effective becomes non-effective, the data signal enters a stable time period from a jump variation time period; and in a non-effective time period of the row synchronization signal and the stable time period of the data signal, making the touch signal charged to a peak.

In some embodiments, in an effective time period of the data enabling signal, making a scan clock signal in an effective state, and making the touch signal charged to the peak.

In some embodiments, when the touch display device has frequency variation, the time control method further comprises:

adjusting a frequency of a frame enabling signal to make a frequency of the row synchronization signal and a frequency of the touch signal vary accordingly;

determining each of touch node basis capacitor values corresponding to a current frequency according to the touch node basis capacitor values corresponding to different frequencies of the touch display device stored in advance; and determining a location of a target touch node according to each of the touch node basis capacitor values corresponding to the current frequency of the touch display device.

In some embodiments, when the touch display device has frequency variation, the time control method further comprises:

keeping the frequency of the frame enabling signal to make the frequency of the row synchronization signal and the frequency of the touch signal keep constant; and determining a location of a target touch node according to each of the touch node basis capacitor values corresponding to an initial frequency of the touch display device.

Advantages

In the touch display device and time control method thereof provided by the embodiment of the present invention, the time controller receives a row synchronization signal, a data driver makes a data signal jump within an effective time period of the row synchronization signal and keep stable in a non-effective time period of the row synchronization signal. In the meantime, an input controller makes a charge time period of a touch signal within the non-effective time period of the row synchronization signal. As such, the data signal would suffer crosstalk in a jump variation time period due to charging of the touch signal such that when the touch display device operates, no crosstalk forming a phenomenon such as interfering horizontal mura is caused to a data line due to charging of the touch electrode.

DETAILED DESCRIPTION OF PREFERRED EMBODIMENTS

To make the objective, the technical solution, and the effect of the present application clearer and more explicit, the present application will be further described in detail below with reference to the accompanying drawings. It should be understood that the specific embodiments described here are only used to explain the present application instead of being used to limit the present application.

Figure 1:
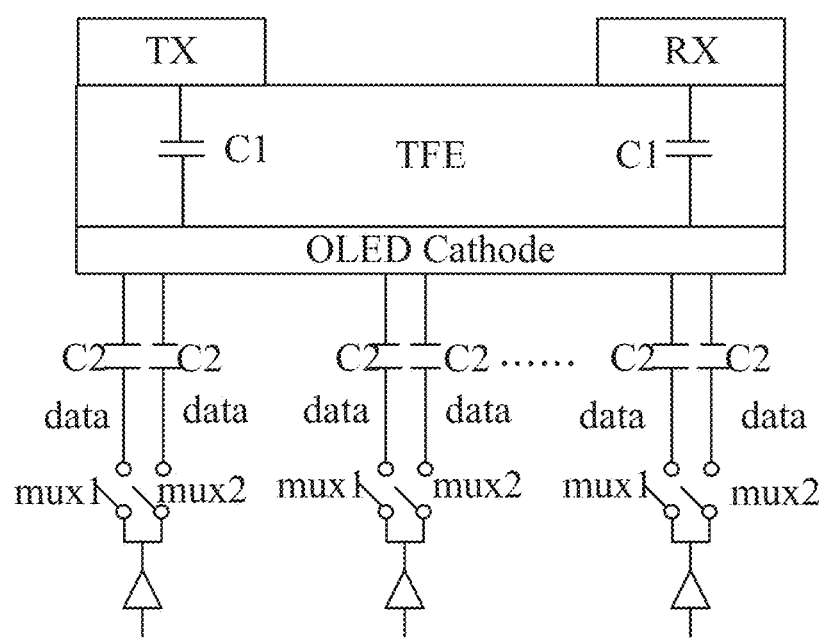
FIG. 1 is a schematic structural view of a conventional OLED touch display device.
Figure 2:
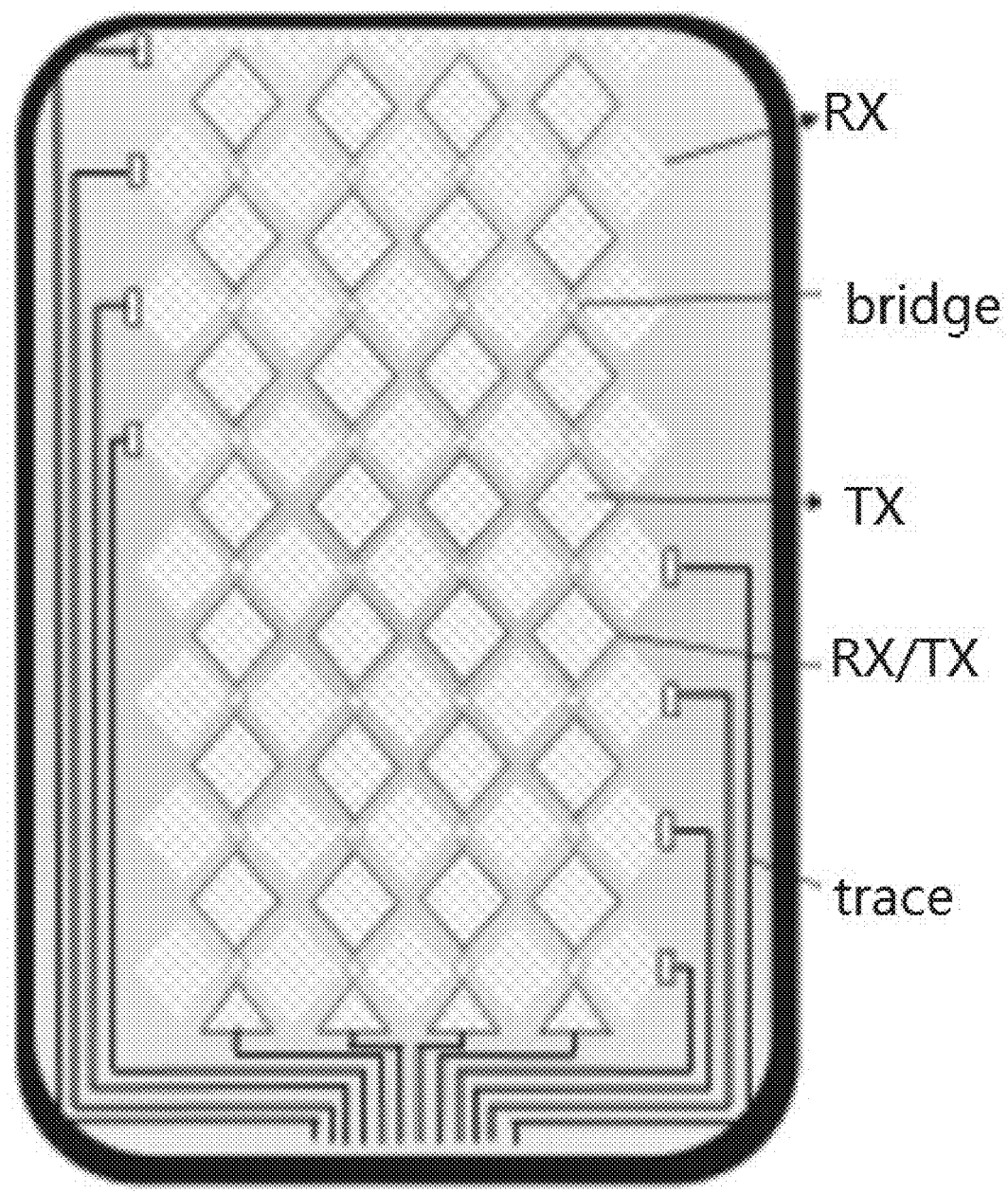
FIG. 2 is a schematic view of a layout of a touch sensor of the touch display device provided by the embodiment of the present invention.

With reference to FIG. 1, For an organic light emitting diode (OLED) touch display device with synchronized touch and display, a the touch signal TP generates crosstalk to a data line to result in influence of the touch operation to display images because a parasitic capacitor C1 is formed between a touch electrode (a mutual capacitive screen employing a 1 to 2 demux source electrode driver circuit as shown in FIG. 1, the touch electrodes comprise transmitter electrodes TX and receiver electrodes RX, and demux switches comprise mux1 and mux2) above a thin film encapsulation layer TFE and cathodes of the organic light emitting diode OLED under the thin film encapsulation layer TFE, and a parasitic capacitor C2 formed between the cathode of the organic light emitting diode OLED and a data line (data, or called source). Therefore, the touch electrode (TX and RX) interferes with the cathode of the organic light emitting diode, the cathode of the organic light emitting diode further interferes with a voltage of the data line data to result in indirect interference of the touch electrode (the transmitter electrode TX and receiver electrode RX) with a potential of the data line data to influence display effect. With reference to FIG. 2, the touch electrodes of the touch display device, namely, the transmitter electrodes TX and the receiver electrodes RX are arranged longitudinally and laterally, the touch electrodes are connected through conductive bridges, and are connected to outside through touch wirings (traces).

Figure 3:
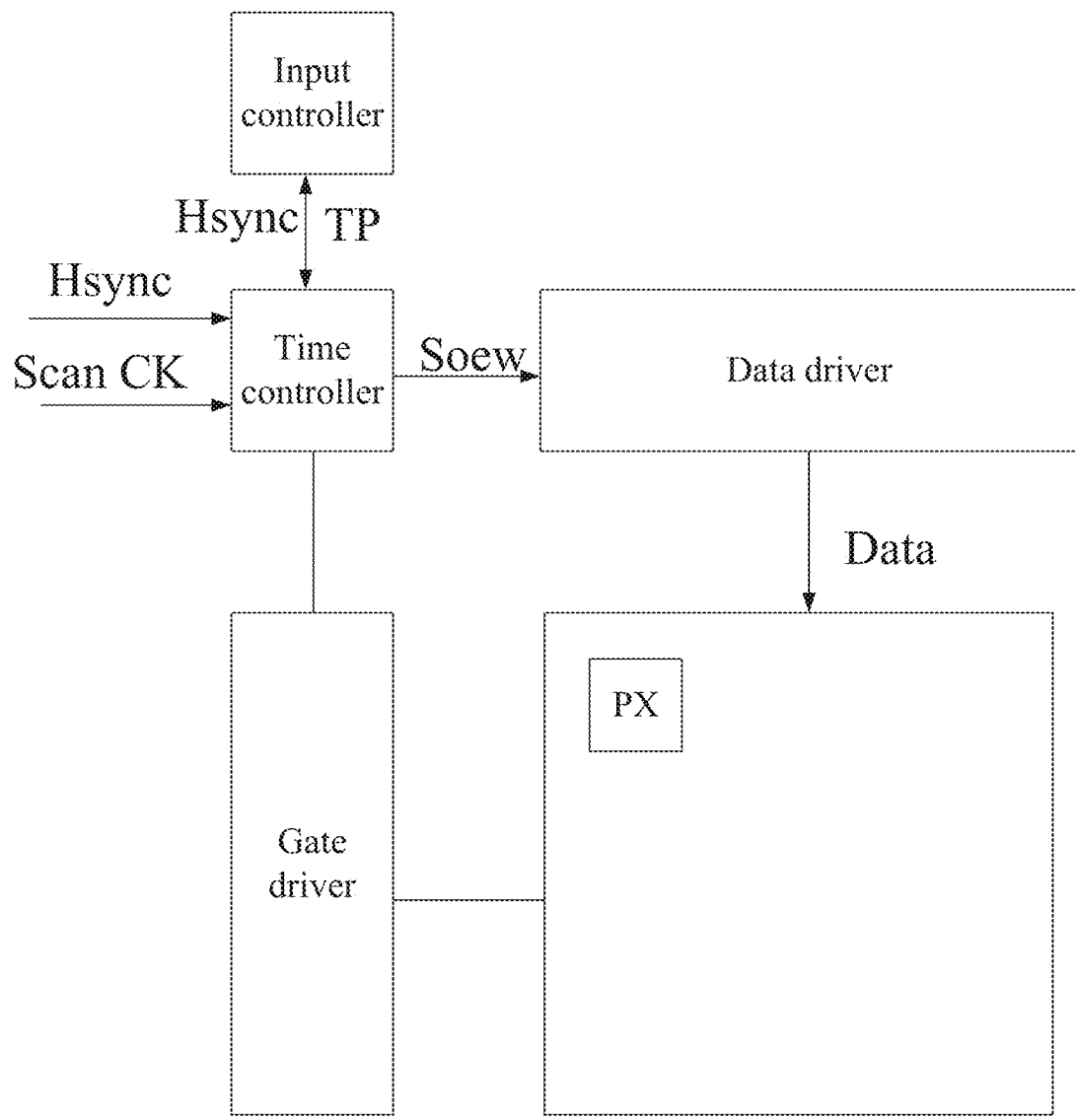
FIG. 3 is a schematic structural view of the touch display device provided by the embodiment of the present invention.
Figure 4:
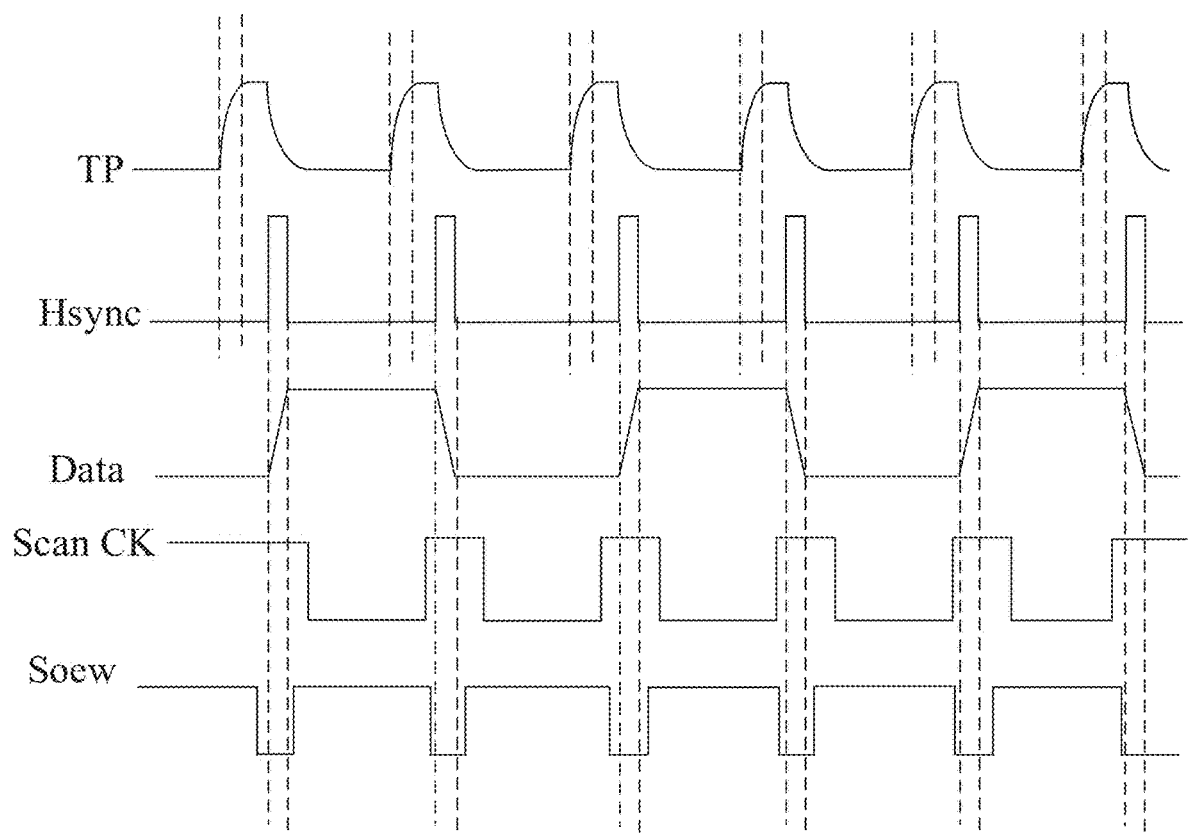
FIG. 4 is a schematic time chart of the touch display device provided by the embodiment of the present invention.

As such, with reference to FIGS. 3 and 4, the embodiment of the present application provides a touch display device comprising a touch sensor (i.e., touch electrode) configured to sense a user's touch signal, and the touch display device comprises:

a time controller (Tcon) configured to receive a row synchronization signal Hsync, wherein the row synchronization signal Hsync comprises an effective time period and a non-effective time period;

a data driver (Source driver) configured to generate a data signal Data responsive to the row synchronization signal Hsync, wherein the data signal Data comprises a jump variation time period and a sustain time period, wherein the jump variation time period of the data signal Data corresponds to the effective time period of the row synchronization signal Hsync, and the sustain time period of the data signal Data corresponds to the non-effective time period of the row synchronization signal Hsync;

an input controller configured to generate a touch signal TP and transmit the touch signal TP to the touch sensor, wherein the touch signal TP comprises a charge time period, namely, a rising edge of the touch signal TP is within the non-effective time period of the row synchronization signal Hsync.

In particular, the row synchronization signal Hsync refers to a beginning of one row. When a gate electrode driver switches on a row of pixel units, the time controller (Tcon) receives the row synchronization signal Hsync, in the effective time period of the row synchronization signal Hsync, the data driver (source driver) makes the data signal Data jump (become greater or smaller). In the non-effective time period of the row synchronization signal Hsync, the data signal Data keeps constant. In FIG. 4, the effective time period of the row synchronization signal Hsync is in a high level, the jump variation time period of the data signal Data is a rising edge or a falling edge of the data signal Data. The sustain time period of the data signal Data is a high level or a low level of the data signal Data keeping stable. The input controller can set a phase of the touch signal TP according to the effective time period of the row synchronization signal Hsync to prevent interfering horizontal mura formed by crosstalk of the touch signal TP to the data signal Data due to interference between the row synchronization signal Hsync and the touch signal TP.

In the touch display device and time control method thereof provided by the embodiment of the present invention, the time controller receives a row synchronization signal Hsync, a data driver makes a data signal Data jump within an effective time period of the row synchronization signal Hsync and keep stable in a non-effective time period of the row synchronization signal Hsync. In the meantime, an input controller makes a charge time period of a touch signal TP within the non-effective time period of the row synchronization signal Hsync. As such, the data signal Data would suffer crosstalk in a jump variation time period due to charging of the touch signal TP such that when the touch display device operates, no crosstalk forming a phenomenon such as interfering horizontal mura is caused to a data line due to charging of the touch electrode.

It should be explained that the charge time period of the touch signal TP is a time period inputting signals into the touch electrode. Therefore, a signal energy of the charge time period (rising edge) of the touch signal TP is greater than a signal energy of a discharge time period (falling edge) so the embodiment of the present invention mainly focuses on the rising edge of the touch signal TP. Actually, it is also allowable to entirely adjust the charge time period and the discharge time period of the touch signal TP. Namely, embodiments setting the rising edge of the touch signal TP within the non-effective period of the row synchronization signal Hsync to prevent the rising edge of the touch signal TP in the data signal Data jump variation time period from interfering the data signal Data are in a protective scope of the present invention.

Furthermore, with reference to FIGS. 3 and 4, the time controller is further configured to receive a scan clock signal Scan CK, and to control a data enabling signal SOEW of the data driver. Each of the scan clock signal Scan CK and the data enabling signal SOEW comprises an effective time period and a non-effective time period. The effective time period of the scan clock signal Scan CK is within the sustain time period of the data signal Data, and is within the effective time period of the data enabling signal SOEW. The input controller is further configured to make the charge time period of the touch signal TP within the effective time period of the data enabling signal SOEW. In the present embodiment, the effective time period of the scan clock signal Scan CK is in a low level, and the effective time period of the data enabling signal SOEW is in a high level.

In particular, when a row of pixel units switch on, the scan clock signal Scan CK achieves to be effective to make the data line written with the data signal Data. It can be understood that generally, the data signal Data has been established and maintained for a period of time before the scan clock signal Scan CK achieves to be effective and is maintained for a period of time after the scan clock signal Scan CK becomes non-effective, which is to make the data line able to be stably written with the data signal Data.

Figure 5:
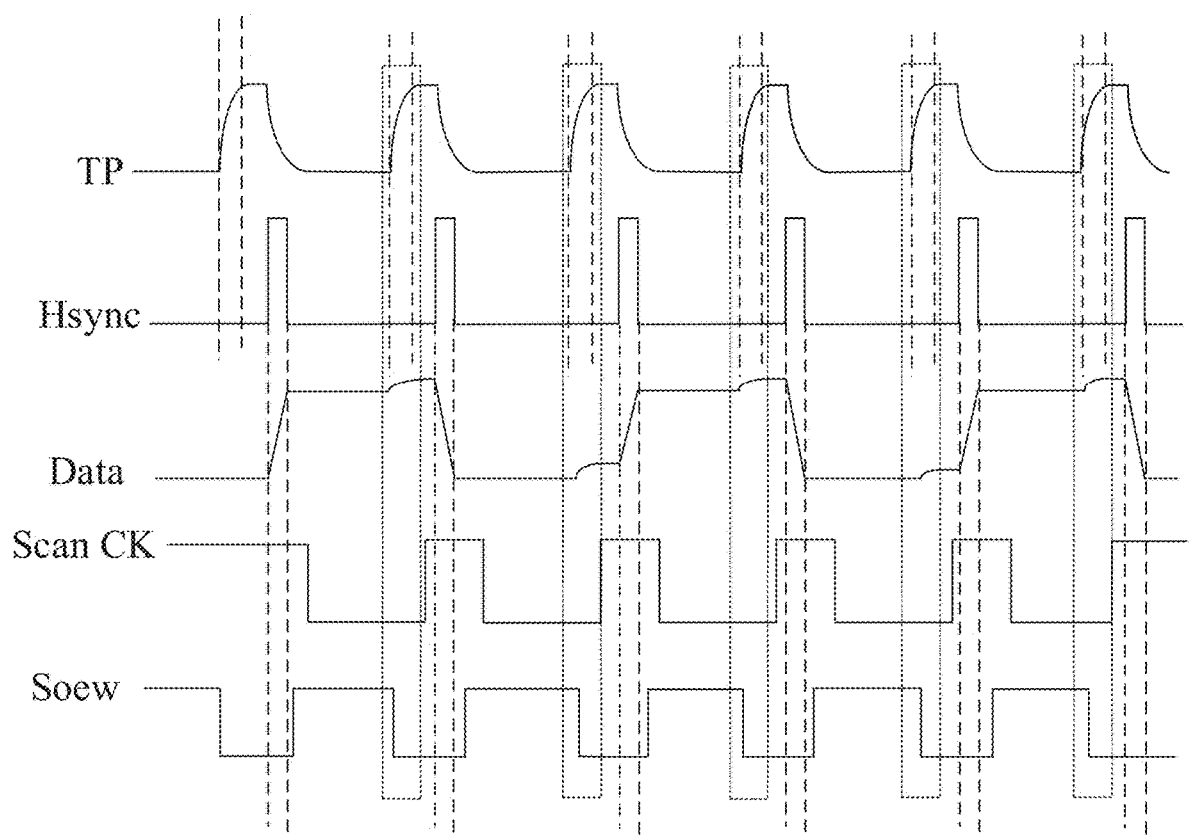
FIG. 5 is a schematic wave chart of a data signal of a conventional data enabling signal switching off prior to a scan clock signal.

The data enabling signal SOEW is a signal making the data signal Data effective. Namely, when the data enabling signal SOEW is effective, a corresponding data signal Data can be written into the data line. When the data enabling signal SOEW is non-effective, a corresponding data signal Data is not inputted to the data line. As such, when the data enabling signal SOEW is effective and the scan clock signal is effective, because data line constantly receives the data signal Data, the potential on the data line keeps stable instead of being interfered with the touch signal TP. When the scan clock signal is effective but the data enabling signal SOEW is non-effective, with reference to FIG. 5, the data line stops receiving the data signal Data. At this time, the potential of the data line is easily interfered with the touch signal TP, and the potential of the data line will be pulled up along the rising edge of the touch signal TP.

Namely, in the sustain time period of the data signal Data, the data signal Data is also easily interfered with the touch signal TP when the data enabling signal SOEW is non-effective such that the data signal Data inputted into the data line is unstable when the scan clock signal Scan CK is effective and the data enabling signal SOEW non-effective. As such, with reference to FIG. 4, the present embodiment also makes both the effective time period of the scan clock signal Scan CK and the charge time period of the touch signal TP within the effective time period of the data enabling signal SOEW such that when the scan clock signal Scan CK is effective, the data enabling signal SOEW can make the data signal Data keep effective without interference by the touch signal TP. As such, the data line can be stably written with the data signal Data without suffering crosstalk of the touch electrode such that the charging the touch electrode would not affect display images. Even, the effective time period of the data enabling signal SOEW can be set to correspond to the sustain time period of the data signal Data such that the data signal Data can always keep constant in the sustain time period. It should be noted that the data enabling signal SOEW is in a low level within a jump variation time of the data signal Data such that the data signal Data in the jump variation time is non-effective to make the data signal Data jump.

Furthermore, the input controller can also be configured to reduce a duty ratio of the touch signal TP to shorten the charge time period of the touch signal TP such that the data signal Data is as less influenced by the charge time period of the touch signal TP as possible to as less generate an issue of crosstalk as possible.

Figure 6:
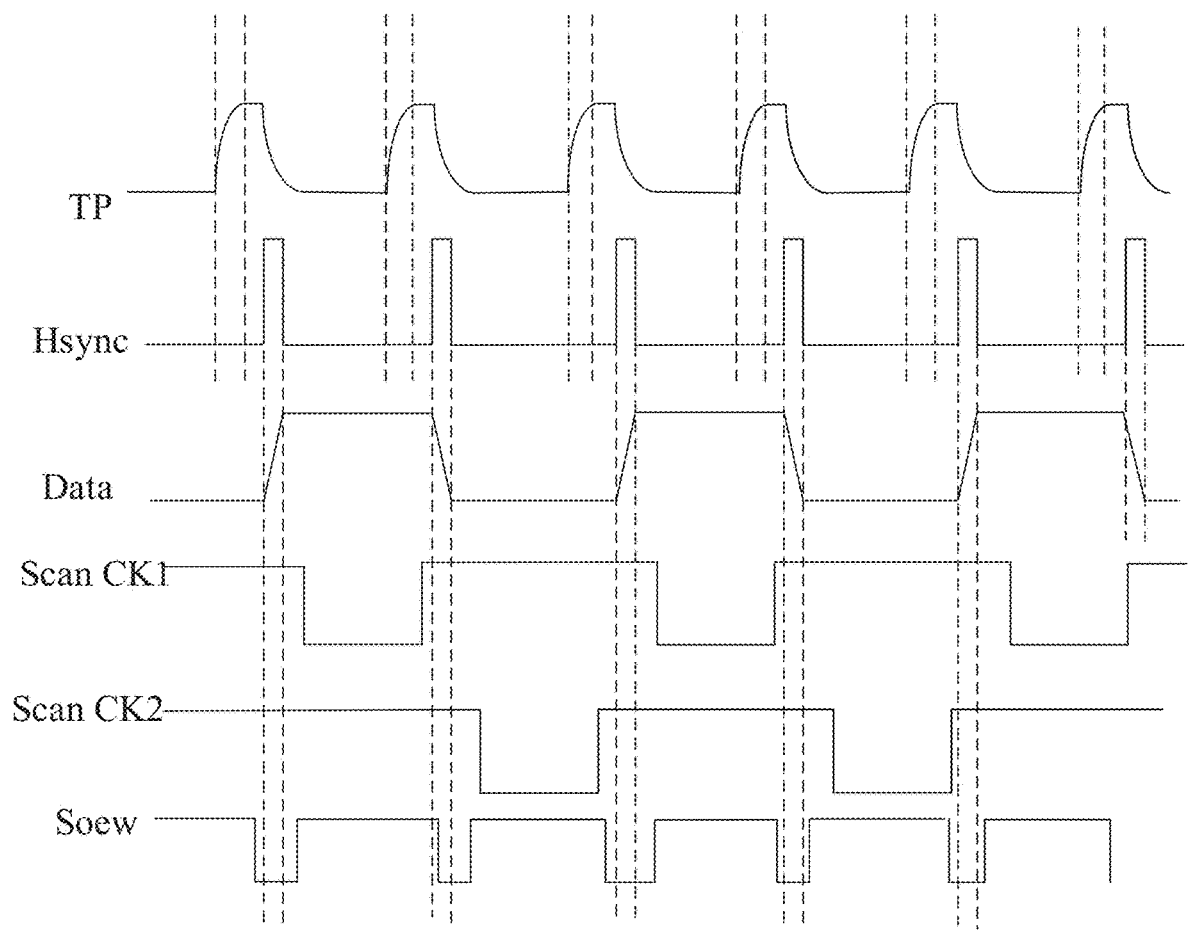
FIG. 6 is another schematic time chart of the touch display device provided by the embodiment of the present invention.

Furthermore, with reference to FIG. 6, the scan clock signal Scan CK can comprise a first scan clock signal Scan CK1 and a second scan clock signal Scan CK2 with the same frequency and opposite phases. The first scan clock signal Scan CK1 is configured to control pixels of odd rows written with the data signal Data. The second scan clock signal Scan CK2 is configured to control pixels of even rows written with the data signal Data. As such, using two scan clock signals to control discharging of the pixels of odd rows and the pixels of even rows respectively reduces delay of only using a single clock signal and prevents hysteresis of the scan clock signal.

Furthermore, besides the touch signal TP would generate crosstalk to the data signal Data, the data signal Data also causes crosstalk to the touch signal TP such that the touch signal TP generates noise. Therefore, to reduce a crosstalk issue between touch electrode and the data line as much as possible, the touch signal TP is usually driven by a frequency the same as that of the display signal. For example, the frequency of the touch signal TP is synchronized with the frequency of the row synchronization signal Hsync of the display signal.

It should be explained that touch node basis capacitor values are touch node capacitor values of the touch display device not touched. For a mutual capacitive touch display device, the touch electrode comprises a transmitter electrode and a receiver electrode, and then the touch node capacitor value is a capacitor value between the transmitter electrode and the receiver electrode. Table 1 and Table 2 are examples for touch node basis capacitor values of the transmitter electrode and the receiver electrode corresponding to the touch display device provided by the embodiment of the present invention at frequencies of 120 Hz and 60 Hz respectively. For a self-capacitive touch display device, the touch node capacitor value is a capacitor value between the touch electrode and a ground.

TABLE 1

Touch node basis capacitor values corresponding to 120 hz

|     | RX1  | RX2  | ... | RX8  | ... |
|-----|------|------|-----|------|-----|
| TX1 | 2136 | 2197 | ... | 2145 | ... |
| TX2 | 2385 | 2358 | ... | 2307 | ... |
| ... | ...  | ...  | ... | ...  | ... |
| TX8 | 2401 | 2383 | ... | 2341 | ... |
| ... | ...  | ...  | ... | ...  | ... |

TABLE 2

Touch node basis capacitor values corresponding to 60 hz

|     | RX1  | RX2  | ... | RX8  | ... |
|-----|------|------|-----|------|-----|
| TX1 | 4646 | 2197 | ... | 4665 | ... |
| TX2 | 4629 | 2358 | ... | ...  | ... |
| ... | ...  | ...  | ... | ...  | ... |
| TX8 | 4661 | 4625 | ... | 4545 | ... |
| ... | ...  | ...  | ... | ...  | ... |

Further, it should be explained that touch display device generally determines a location of a target touch node according to variation of a capacitor value of each touch node, wherein variation of a capacitor value of each touch node refers to a difference between the touch node basis capacitor value of the touch display device not touched, and the touch node capacitor value of the touch display device touched. Namely, touch node basis capacitor values directly determines whether variation of the capacitor value of each node of the touch display device before and after touched is correct. When a frequency of the touch signal TP varies, because a capacitor charging time of the touch node, the touch node basis capacitor value also varies. Therefore, generally, auto calibration is performed to the touch node basis capacitor values. A finger still touching the touch display device in this time of the auto calibration would leads to calibration of the touch node basis capacitor values also containing touch node capacitor variation due to the finger touch, which results in imprecision of the calibrated touch node basis capacitor values such that the capacitor value variation of the touch display device before and after touch are imprecise and is unable to precisely determine the location of the target touch node and causes an issue of missing touch points and incorrect touch points during touch operation.

For the issue, when the touch display device has frequency variation, two ways guaranteeing precisely acquiring each of the touch node basis capacitor values are also provided such that a location of a target touch point can be determined according to a difference between each node basis capacitor value and a capacitor value of each node of the touch display device touched.

Figure 7:
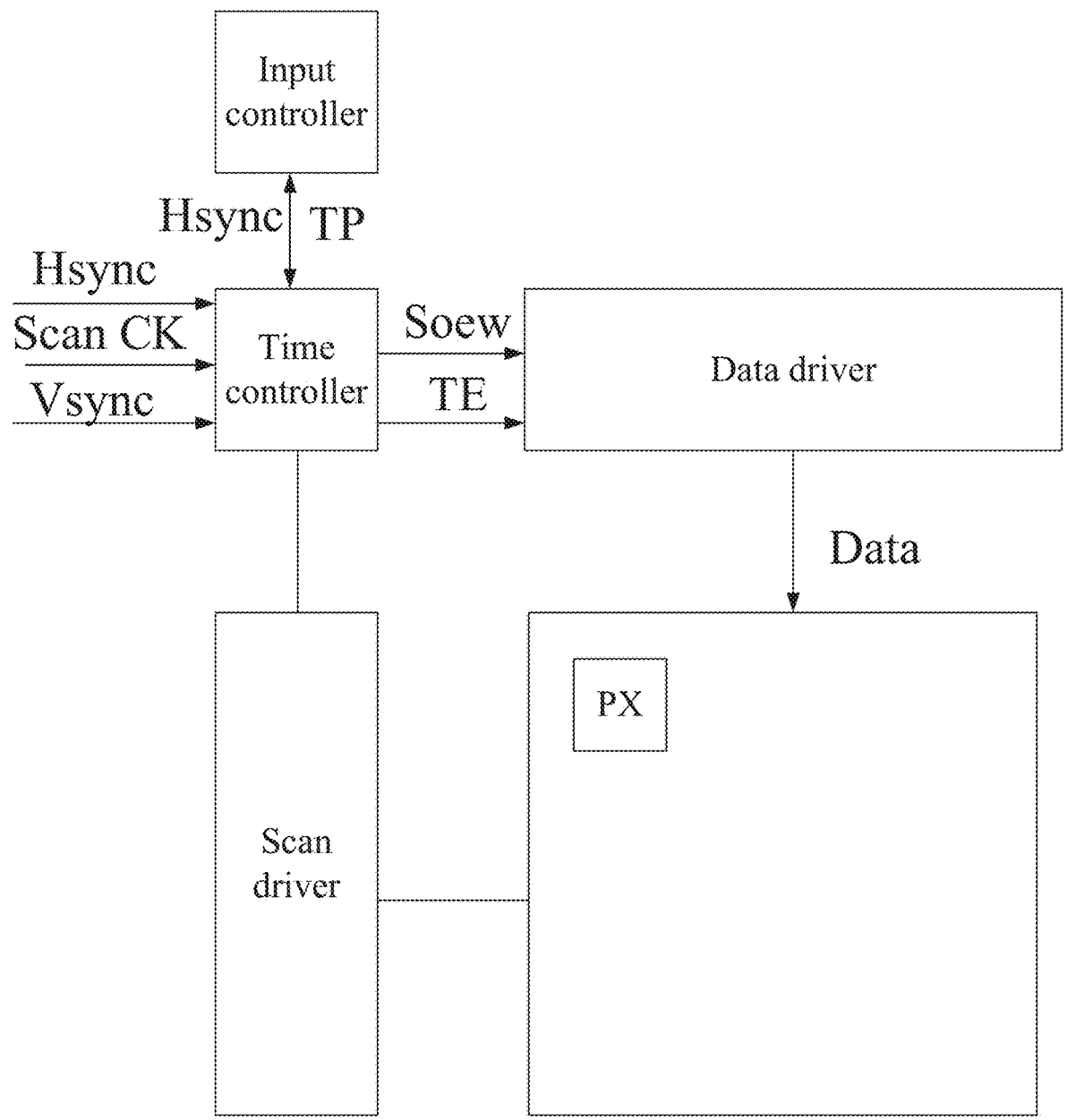
FIG. 7 is another schematic structural view of the touch display device provided by the embodiment of the present invention.

In particular, with reference to FIG. 7, the time controller is further configured to receive a frame synchronization signal Vsync and generate a frame enabling signal TE configured to control the data driver. The frame enabling signal TE is a signal making the data signal Data in the frame synchronization signal Vsync effective. The input controller stores touch node basis capacitor values corresponding to different frequencies of the touch display device in advance. The touch node basis capacitor values are touch node capacitor values of the touch display device not touched.

Figure 8:
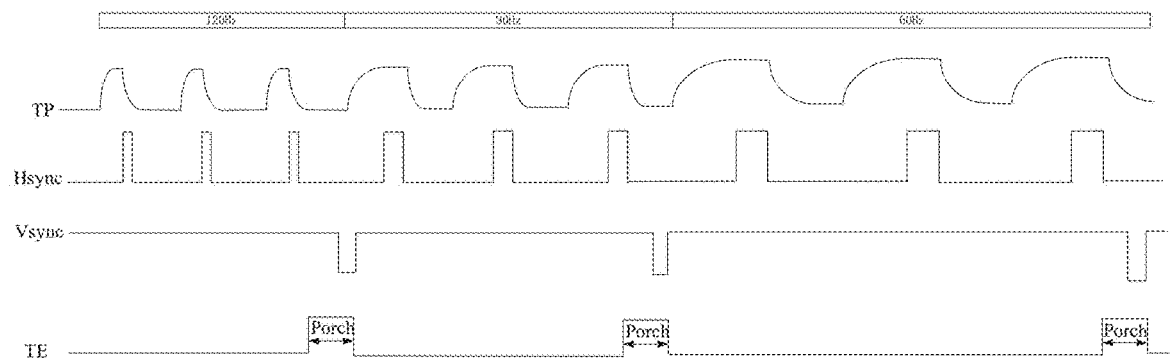
FIG. 8 is a schematic time chart of the touch display device provided by the embodiment of the present invention with a frequency varying while a frequency of a row synchronization signal and a frequency of a touch signal keep constant.

One of the ways is as follow: with reference to FIG. 8, when the touch display device has frequency variation, the time controller is further configured to adjust a frequency of the frame enabling signal TE such that the frequency of the row synchronization signal Hsync varies accordingly. The input controller is further configured to make the frequency of the touch signal TP vary accordingly, determine each of the touch node basis capacitor values corresponding to a current frequency according to the touch node basis capacitor values corresponding to the different frequencies of the touch display device stored in advance, and determine a location of a target touch node according to each of the touch node basis capacitor values corresponding to the current frequency of the touch display device.

When the touch display device of the present embodiment has frequency variation, the time controller adjusts the frequency of the frame enabling signal TE such as a frequency of the row synchronization signal Hsync varies according to a frequency of the touch display device. The input controller makes the frequency of the touch signal TP vary according to the frequency of the touch display device. Namely, when the frequency of the touch display device becomes lower, both the row synchronization signal Hsync and the frequency of the touch signal TP become lower accordingly. Alternatively, when the frequency of the touch display device becomes higher, the row synchronization signal Hsync and the frequency of the touch signal TP become higher accordingly. At this time, the input controller determines each of the touch node basis capacitor values corresponding to the current frequency of the touch display device according to the touch node basis capacitor values corresponding to the different frequencies of the touch display device stored in advance, and then determines a location of a target touch node according to a difference between each of the touch node basis capacitor values corresponding to the current frequency of the touch display device and a touch node capacitor value of the touch display device touched.

Figure 9:
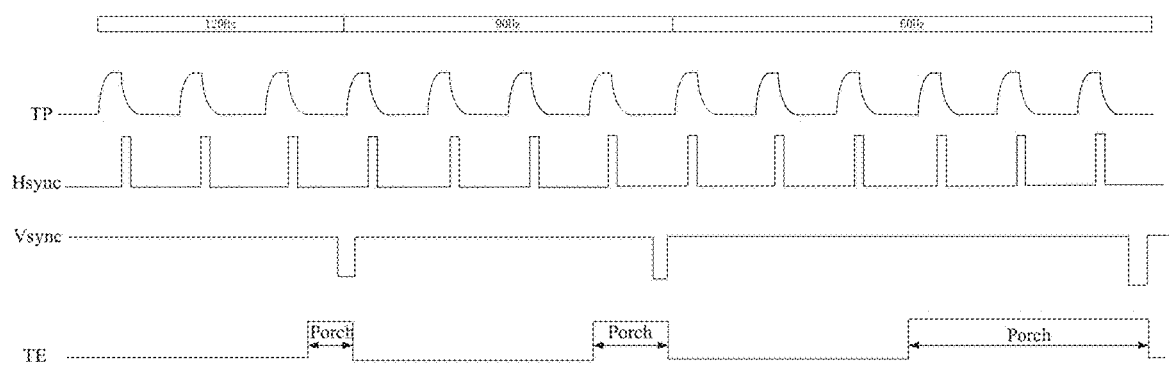
FIG. 9 is a schematic time chart of the touch display device provided by the embodiment of the present invention with the frequency varying while the frequency of the row synchronization signal and the frequency of the touch signal vary.

Another is as follows: With reference to FIG. 9, when the touch display device has frequency variation, the time controller is further configured to the frequency of the frame enabling signal TE to make the frequency of the row synchronization signal Hsync keep constant; and the input controller is further configured to make the frequency of the touch signal TP keep constant, and a location of a target touch node is determined according to each of the touch node basis capacitor values corresponding to an initial frequency of the touch display device.

When the touch display device of the present embodiment has frequency variation, the time controller keeps the of the frequency of the frame enabling signal TE such that the frequency of the row synchronization signal Hsync keeps constant. The input controller makes the frequency of the touch signal TP keep constant according to the frequency of the touch display device. Namely, no matter what frequency the frequency of the touch display device becomes, the frequency of the row synchronization signal Hsync and the frequency of the touch signal TP keep constant, both keep the frequency corresponding to the initial frequency of the touch display device such that each of the touch node basis capacitor values of the touch display device can keep constant. At this time, the input controller determines a location of a target touch node according to a difference of each of the touch node basis capacitor values corresponding to the initial frequency of the touch display device and a touch node capacitor value of the touch display device touched.

The time controller is specifically configured to adjust a length of a front shoulder or a rear shoulder (porch) of the frame enabling signal TE according to the frequency variation of the touch display device to keep the frequency of the frame enabling signal TE constant, and length variation of the front shoulder or the rear shoulder of the frame enabling signal TE is negatively relative to the frequency of the touch display device. FIG. 9 shows adjustment of the length of the rear shoulder of the frame enabling signal TE. When the frequency of the touch display device sequentially becomes 120 hz, 90 hz, and 60 hz, 的 the length of the rear shoulder of the frame enabling signal TE gradually increases.

In particular, when the touch display device has frequency variation, the length of the front shoulder or the rear shoulder of the frame enabling signal TE can be changed such that in each frame time corresponding to the current frequency, and each frame time corresponding to the initial frequency of the touch display device, a data writing time at the same time is performed to make the frequency of the row synchronization signal Hsync keep constant. It can be understood that when the frequency of the touch display device becomes lower, each frame time becomes longer. Therefore, to keep the data writing time in each frame time constant, the length of the front shoulder or the rear shoulder of the frame enabling signal TE needs to increase. Alternatively, when the frequency of the touch display device become higher, each frame time becomes longer. Therefore, to keep the data writing time in each frame time constant, the length of the front shoulder or the rear shoulder of the frame enabling signal TE needs to decrease. Namely, the length of the front shoulder or the rear shoulder of the frame enabling signal TE is negatively relative to the frequency of the touch display device. Increasing the length of the front shoulder or the rear shoulder of the frame enabling signal TE keeps the display signal time at a high frequency when the touch display device is at a low frequency. Furthermore, decreasing the length of the front shoulder or the rear shoulder of the frame enabling signal TE keeps the display signal time at a low frequency when the touch display device is at a high frequency. As such, no matter what frequency the touch display device employs, the row synchronization signal Hsync can keeps a frequency corresponding to the initial frequency of the touch display device, and the touch signal TP and the row synchronization signal Hsync are synchronized to make the frequency of the touch signal TP keep constant. Namely, the touch node basis capacitor values are constant and are always the touch node basis capacitor values corresponding to the initial frequency of the touch display device.

It should be explained that the embodiment of the present invention, the row synchronization signal Hsync, the scan clock signal Scan, the frame synchronization signal Vsync, and the frame enabling signal Vsync received by the time controller Tcon is acquired by a system on a chip Soc disposed at a front end of the time controller processing by a graphic processor GPU.

Figure 10:
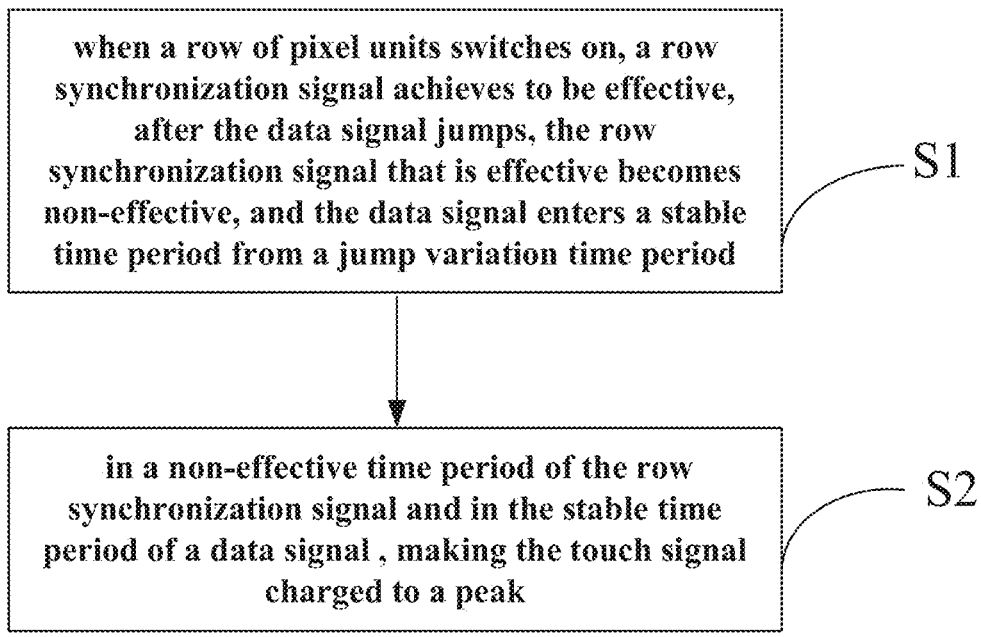
FIG. 10 is a first schematic flowchart of the touch display device provided by the embodiment of the present invention.

According to the above embodiment, with reference to FIGS. 4 and 10, the embodiment of the present invention further comprises a time control method for a touch display device, the time control method comprises steps as follows:

A step S1 comprises when a row of pixel units switches on, a row synchronization signal Hsync achieves to be effective, after the data signal Data jumps, the row synchronization signal Hsync that is effective becomes non-effective, and the data signal Data enters a stable time period from a jump variation time period.

A step S2 comprises in a non-effective time period of the row synchronization signal Hsync and in the stable time period of a data signal Data, making the touch signal TP charged to a peak.

In particular, when the gate electrode driver circuit switches on a row of pixel units, a display signal time control module simultaneously outputs the row synchronization signal Hsync, the data signal Data starts to jump to a peak or a valley and then enters the stable time period. At this time, the row synchronization signal Hsync that is effective becomes non-effective. In the non-effective time period of the row synchronization signal Hsync and in the stable time period of the data signal Data, a time control module for the touch signal TP is in a non-effective time period of the row scan synchronization signal (generally a later time period of the non-effective time period of the row scan synchronization signal is selected, namely, a horizontal blank (HBlank) time period after a row of pixel units are written with the data signal Data), and makes the touch signal TP charged to prevent the data line from influence by the charge time period of the touch signal TP and generating crosstalk.

Figure 11:
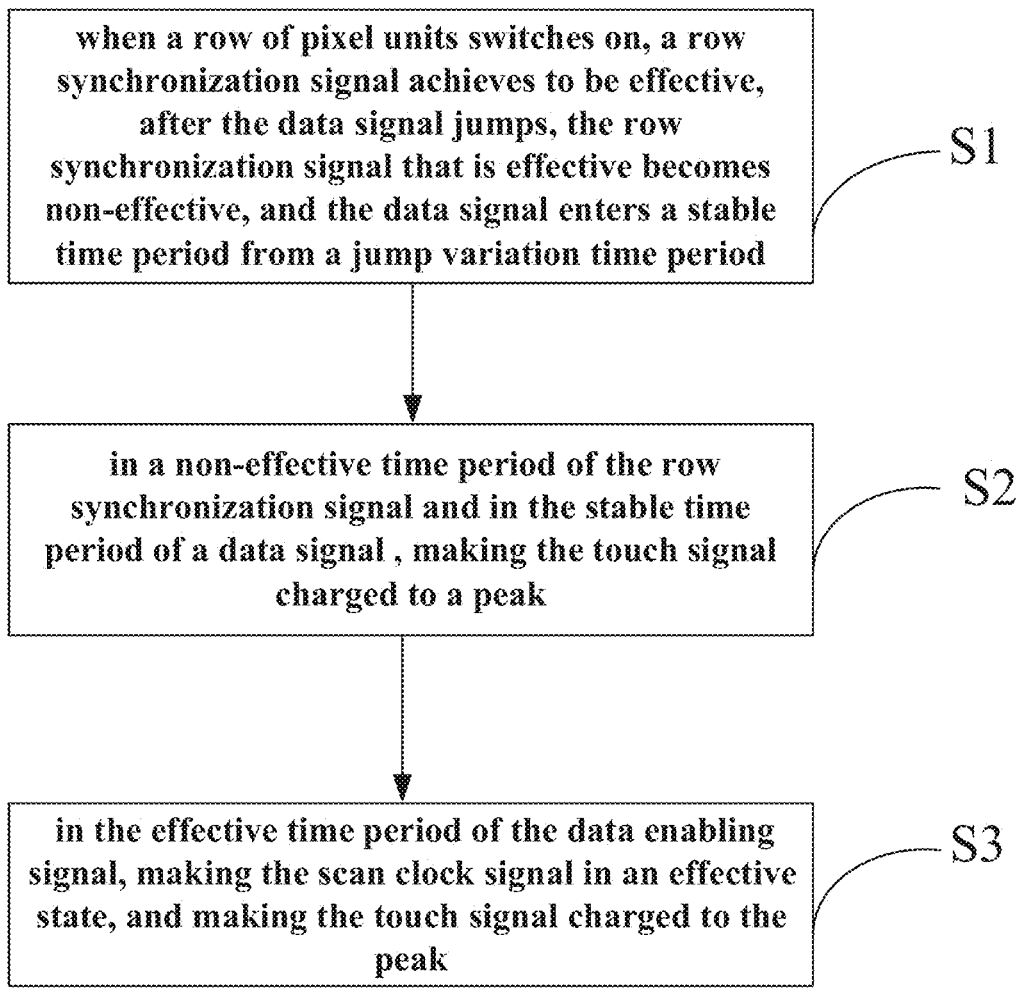
FIG. 11 is a second schematic flowchart of the touch display device provided by the embodiment of the present invention.

Furthermore, with reference to FIGS. 4 and 11, the time control method for a touch display device further comprises a step as follows:

A step S3 comprises in the effective time period of the data enabling signal SOEW, making the scan clock signal Scan CK in an effective state, and making the touch signal TP charged to the peak.

In particular, the present embodiment also makes the effective time period of the scan clock signal Scan CK and the charge time period of the touch signal TP within the effective time period of the data enabling signal SOEW such that when the scan clock signal Scan CK is effective, the data enabling signal SOEW can make the data signal Data constantly effective without interference by charging of the touch signal TP. As such, the data line can be constantly and stably written with the data signal Data without suffering crosstalk of the touch electrode such that charging the touch electrode would not affect display images. Even, the effective time period of the data enabling signal SOEW can be set to correspond to the sustain time period of the data signal Data such that the data signal Data can constantly keep stable in the sustain time period.

Figure 12:
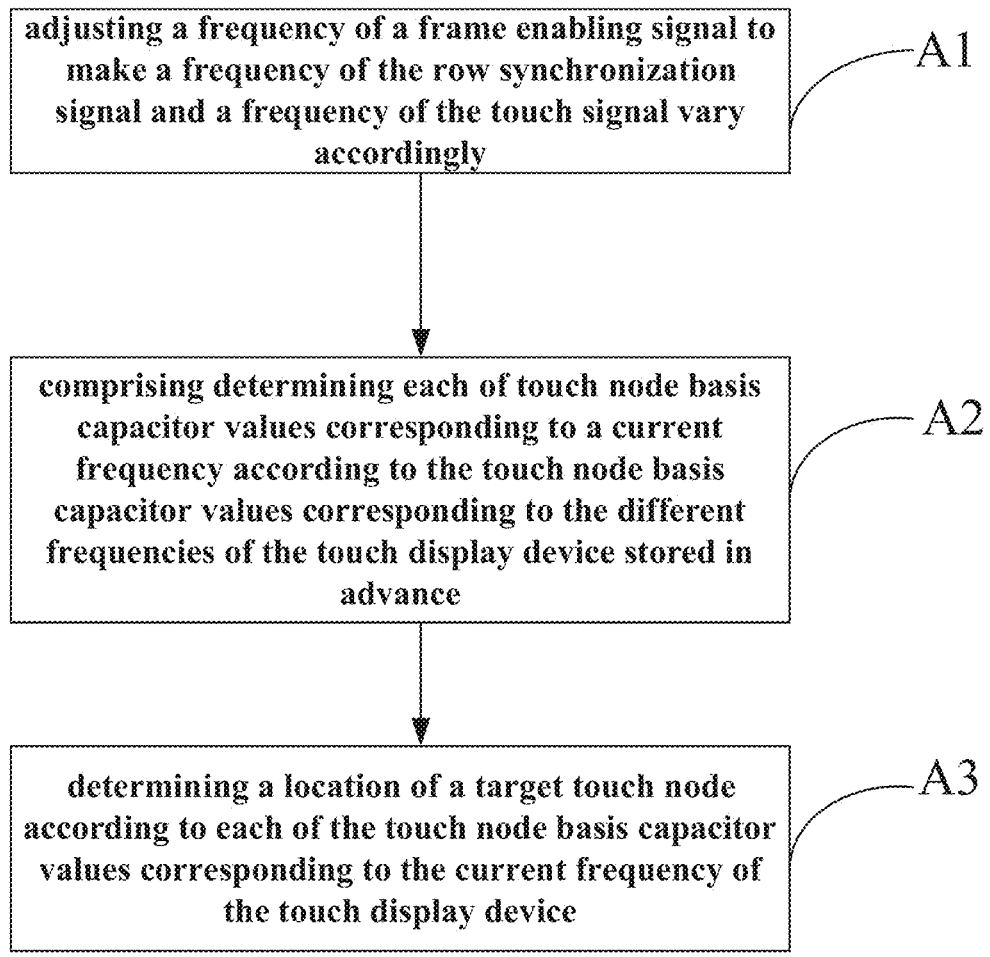
FIG. 12 is a third schematic flowchart of the touch display device provided by the embodiment of the present invention.

According to the above embodiment, with reference to FIGS. 8 and 12, when the touch display device has frequency variation, the time control method further comprises:

a step A1 comprising adjusting a frequency of a frame enabling signal TE to make a frequency of the row synchronization signal Hsync and a frequency of the touch signal TP vary accordingly;

a step A2 comprising determining each of touch node basis capacitor values corresponding to a current frequency according to the touch node basis capacitor values corresponding to the different frequencies of the touch display device stored in advance; and a step A3 comprising determining a location of a target touch node according to each of the touch node basis capacitor values corresponding to the current frequency of the touch display device.

When the touch display device of the present embodiment has frequency variation, the frequency of the row synchronization signal Hsync and the frequency of the touch signal TP vary according to the frequency of the touch display device. Namely, when the frequency of the touch display device becomes lower, the frequency of the row synchronization signal Hsync and the frequency of the touch signal TP become lower accordingly. Alternatively, when the frequency of the touch display device becomes higher, both the frequency of the row synchronization signal Hsync and the frequency of the touch signal TP become higher accordingly. At this time, each of the touch node basis capacitor values corresponding to a current frequency of the touch display device is determined according to the touch node basis capacitor values corresponding to the different frequencies of the touch display device stored in advance. Then, a location of a target touch node is determined according to a difference between each of the touch node basis capacitor values corresponding to the current frequency of the touch display device and a touch node capacitor value of the touch display device touched.

Figure 13:
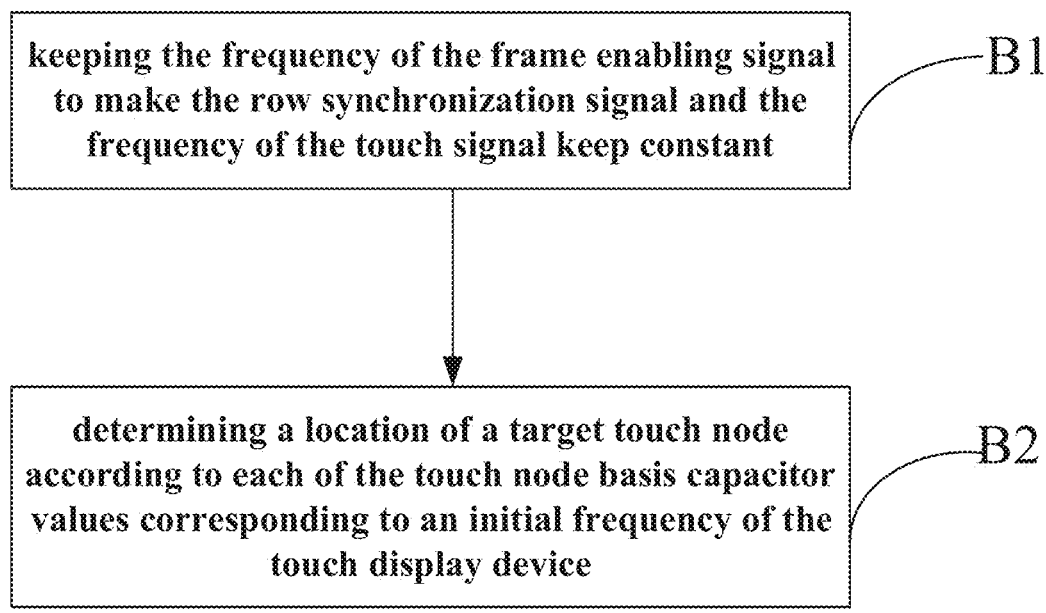
FIG. 13 is a fourth schematic flowchart of the touch display device provided by the embodiment of the present invention.

According to the above embodiment, with reference to FIGS. 9 and 13, when the touch display device has frequency variation, the time control method further comprises:

a step B1 comprising keeping the frequency of the frame enabling signal TE to make the row synchronization signal Hsync and the frequency of the touch signal TP keep constant; and a step B2 comprising determining a location of a target touch node according to each of the touch node basis capacitor values corresponding to an initial frequency of the touch display device.

When the touch display device of the present embodiment has frequency variation, the frequency of the row synchronization signal Hsync and the frequency the touch signal TP keep constant according to the frequency of the touch display device. Namely, no matter what frequency the frequency of the touch display device becomes, the frequency of the row synchronization signal Hsync and the frequency of the touch signal TP keep constant, both keep the frequency corresponding to the initial frequency of the touch display device such that each of the touch node basis capacitor values of the touch display device can keep constant. At this time, a location of a target touch node is determined according to a difference of each of the touch node basis capacitor values corresponding to the initial frequency of the touch display device and a touch node capacitor value of the touch display device touched.

In the touch display device provided by the embodiment of the present invention, the time controller receives a row synchronization signal Hsync, a data driver makes a data signal Data jump within an effective time period of the row synchronization signal Hsync and keep stable in a non-effective time period of the row synchronization signal Hsync. In the meantime, an input controller makes a charge time period of a touch signal TP (rising edge) within the non-effective time period of the row synchronization signal Hsync. As such, the data signal Data would suffer crosstalk in a jump variation time period due to charging of the touch signal TP such that when the touch display device operates, no crosstalk forming a phenomenon such as interfering horizontal mura is caused to a data line due to charging of the touch electrode. Furthermore, also, setting both the effective time period of the scan clock signal Scan CK and the charge time period of the touch signal TP within the effective time period of the data enabling signal SOEW makes the data signal Data able to be written into the data line in the sustain phase without interference by the touch signal.

Furthermore, for a condition of frequency variation of the touch display device, two ways guaranteeing precisely acquiring each of the touch node basis capacitor values are also provided such that a location of a target touch point can be determined according to a difference between each node basis capacitor value and a capacitor value of each node of the touch display device touched. One of the ways is to make frequencies of the row synchronization signal Hsync and the touch signal TP vary according to the frequency variation of the touch display device. However, the touch node basis capacitor values corresponding to the different frequencies of the touch display device stored in advance are selected. Another way is, by changing the length of the front shoulder or the rear shoulder of the frame enabling signal TE, making the frequencies of the row synchronization signal Hsync and the touch signal TP keep constant such that each of the touch node capacitor values is always each of the touch node basis capacitor values corresponding to the initial frequency of the touch display device. Both ways can prevent failure of determining a location of a target touch node due to the imprecise touch node basis capacitor values resulting from a variation amount of capacitor value from erroneous finger touch.

It can be understood that for a person of ordinary skill in the art, equivalent replacements or changes can be made according to the technical solution of the present application and its inventive concept, and all these changes or replacements should belong to the scope of protection of the appended claims of the present application.

What is claimed is:

1. A touch display device, comprising a touch sensor configured to sense a user's touch signal, and further comprising:
   a time controller configured to receive a row synchronization signal, wherein the row synchronization signal comprises an effective time period and a non-effective time period;
   a data driver configured to generate a data signal responsive to the row synchronization signal, wherein the data signal comprises a jump variation time period and a sustain time period; wherein the jump variation time period corresponds to the effective time period of the row synchronization signal, and the sustain time period of the data signal corresponds to the non-effective time period of the row synchronization signal; and
   an input controller configured to generate a touch signal and transmit the touch signal to the touch sensor, wherein the touch signal comprises a charge time period; wherein the charge time period of the touch signal is within the non-effective time period of the row synchronization signal;
   wherein the time controller is further configured to receive a scan clock signal and generate a data enabling signal configured to control the data driver; wherein each of the scan clock signal and the data enabling signal comprises an effective time period and a non-effective time period, the effective time period of the scan clock signal is within the sustain time period of the data signal, and is within the effective time period of the data enabling signal;
   wherein the input controller is further configured to set the charge time period of the touch signal within the effective time period of the data enabling signal.

2. The touch display device according to claim 1, wherein the input controller is further configured to reduce a duty ratio of the touch signal to shorten the charge time period of the touch signal.

3. The touch display device according to claim 1, wherein the time controller is further configured to receive a frame synchronization signal and generate a frame enabling signal configured to control the data driver;
   the input controller stores touch node basis capacitor values corresponding to different frequencies of the touch display device in advance, and the touch node basis capacitor values are touch node capacitor values of the touch display device not touched; and
   when the touch display device has frequency variation, the time controller is further configured to adjust a frequency of the frame enabling signal to make a frequency of the row synchronization signal vary accordingly; the input controller is further configured to make a frequency of the touch signal vary accordingly, determine each of the touch node basis capacitor values corresponding to a current frequency according to the touch node basis capacitor values corresponding to the different frequencies of the touch display device stored in advance, and determine a location of a target touch node according to each of the touch node basis capacitor values corresponding to the current frequency of the touch display device.

4. The touch display device according to claim 3, wherein when the touch display device has the frequency variation, the time controller is further configured to keep the frequency of the frame enabling signal to make the frequency of the row synchronization signal keep constant; the input controller is further configured to make the frequency of the touch signal keep constant, and determine a location of a target touch node according to each of the touch node basis capacitor values corresponding to an initial frequency of the touch display device.

5. The touch display device according to claim 4, wherein the time controller is specifically configured to adjust a length of a front shoulder or a rear shoulder of the frame enabling signal according to frequency variation of the touch display device to keep the frequency of the frame enabling signal constant, and length variation of the front shoulder or the rear shoulder of the frame enabling signal is negatively relative to the frequency variation of the touch display device.

6. The touch display device according to claim 1, wherein the touch display device is a mutual capacitive touch display device.

7. The touch display device according to claim 1, wherein the touch display device is a self-capacitive touch display device.

8. A touch display device, comprising a touch sensor configured to sense a user's touch signal, and further comprising:
- a time controller configured to receive a row synchronization signal, a scan clock signal and a data enabling signal, wherein each of the row synchronization signal, the scan clock signal, and the data enabling signal comprises an effective time period and a non-effective time period;
- a data driver configured to generate a data signal responsive to the row synchronization signal, wherein the data signal comprises a jump variation time period and a sustain time period; wherein the jump variation time period corresponds to the effective time period of the row synchronization signal, and the sustain time period of the data signal corresponds to the non-effective time period of the row synchronization signal; and
- an input controller configured to generate a touch signal and transmit the touch signal to the touch sensor, wherein the touch signal comprises a charge time period; wherein the charge time period of the touch signal is within the non-effective time period of the row synchronization signal and within the effective time period of the data enabling signal;
- wherein the time controller is further configured to receive a frame synchronization signal and generate a frame enabling signal configured to control the data driver;
- wherein the input controller stores touch node basis capacitor values corresponding to different frequencies of the touch display device in advance, and the touch node basis capacitor values are touch node capacitor values of the touch display device not touched; and
- when the touch display device has frequency variation, the time controller is further configured to adjust a frequency of the frame enabling signal to make a frequency of the row synchronization signal vary accordingly; the input controller is further configured to make a frequency of the touch signal vary accordingly, determine each of the touch node basis capacitor values corresponding to a current frequency according to the touch node basis capacitor values corresponding to the different frequencies of the touch display device stored in advance, and determine a location of a target touch node according to each of the touch node basis capacitor values corresponding to the current frequency of the touch display device.

9. The touch display device according to claim 8, wherein the input controller is further configured to reduce a duty ratio of the touch signal to shorten the charge time period of the touch signal.

10. The touch display device according to claim 8, wherein when the touch display device has the frequency variation, the time controller is further configured to keep the frequency of the frame enabling signal to make the frequency of the row synchronization signal keep constant; the input controller is further configured to make the frequency of the touch signal keep constant, and determine a location of a target touch node according to each of the touch node basis capacitor values corresponding to an initial frequency of the touch display device.

11. The touch display device according to claim 10, wherein the time controller is specifically configured to adjust a length of a front shoulder or a rear shoulder of the frame enabling signal according to frequency variation of the touch display device to keep the frequency of the frame enabling signal constant, and length variation of the front shoulder or the rear shoulder of the frame enabling signal is negatively relative to the frequency variation of the touch display device.

12. The touch display device according to claim 8, wherein the touch display device is a mutual capacitive touch display device.

13. The touch display device according to claim 8, wherein the touch display device is a self-capacitive touch display device.

14. A time control method for a touch display device comprising:
- when a row of pixel units switch on, a row synchronization signal achieves to be effective, after a data signal jumps, the row synchronization signal that is effective becomes non-effective, the data signal enters a stable time period from a jump variation time period; and
- in a non-effective time period of the row synchronization signal and the stable time period of the data signal, making a touch signal charged to a peak;
- wherein in an effective time period of a data enabling signal, making a scan clock signal in an effective state, and making the touch signal charged to the peak;
- wherein when the touch display device has frequency variation, and the time control method further comprises:
  - adjusting a frequency of a frame enabling signal to make a frequency of the row synchronization signal and a frequency of the touch signal vary accordingly;
  - determining each of touch node basis capacitor values corresponding to a current frequency according to the touch node basis capacitor values corresponding to different frequencies of the touch display device stored in advance; and
  - determining a location of a target touch node according to each of the touch node basis capacitor values corresponding to the current frequency of the touch display device.

15. The time control method for a touch display device according to claim 14, wherein when the touch display device has frequency variation, and the time control method further comprises:
- keeping the frequency of the frame enabling signal to make the frequency of the row synchronization signal and the frequency of the touch signal keep constant; and determining a location of a target touch node according to each of the touch node basis capacitor values corresponding to an initial frequency of the touch display device.

\* \* \* \* \*